(12) United States Patent
Liu et al.

(10) Patent No.: US 9,065,428 B2
(45) Date of Patent: Jun. 23, 2015

(54) METHOD TO CONTROL SLEW RATE OF A CURRENT-MODE LOGIC OUTPUT DRIVER

(71) Applicant: Advanced Micro Devices, Inc., Sunnyvale, CA (US)

(72) Inventors: Xin Liu, El Dorado Hills, CA (US); Arvind Bomdica, Fremont, CA (US); Ming-Ju Edward Lee, Saratoga, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 14/025,900

(22) Filed: Sep. 13, 2013

(65) Prior Publication Data

US 2014/0077836 A1    Mar. 20, 2014

Related U.S. Application Data

(62) Division of application No. 13/114,479, filed on May 24, 2011, now Pat. No. 8,564,326.

(51) Int. Cl.
*H03K 5/01* (2006.01)
*H04L 25/02* (2006.01)

(52) U.S. Cl.
CPC .............. *H03K 5/01* (2013.01); *H04L 25/0272* (2013.01); *H04L 25/0282* (2013.01)

(58) Field of Classification Search
None
See application file for complete search history.

(56) References Cited

U.S. PATENT DOCUMENTS

| | | | |
|---|---|---|---|
| 7,253,655 B2 | 8/2007 | Kwon et al. | |
| 2003/0001618 A1* | 1/2003 | Haycock et al. | 326/82 |
| 2008/0106297 A1* | 5/2008 | Jao | 326/27 |

* cited by examiner

*Primary Examiner* — Crystal L Hammond

(57) ABSTRACT

A method is provided for selecting at least one of a plurality of slew rate control settings based at least upon a speed of data transmission and receiving input data where the input data is received at the data transmission speed. The method also includes switching the received input data in accordance with the selected at least one of a plurality of slew rate control settings and sending output data at the data transmission speed. Also provided is data driver device that includes at least one activation portion comprising one or more slew rate controls, a voltage-mode driver portion and at least a first current-mode driver portion. Also provided is a computer readable storage device encoded with data for adapting a manufacturing facility to create the data driver device. Also provided is a system including the data driver device, a data storage device and a processor device.

14 Claims, 10 Drawing Sheets

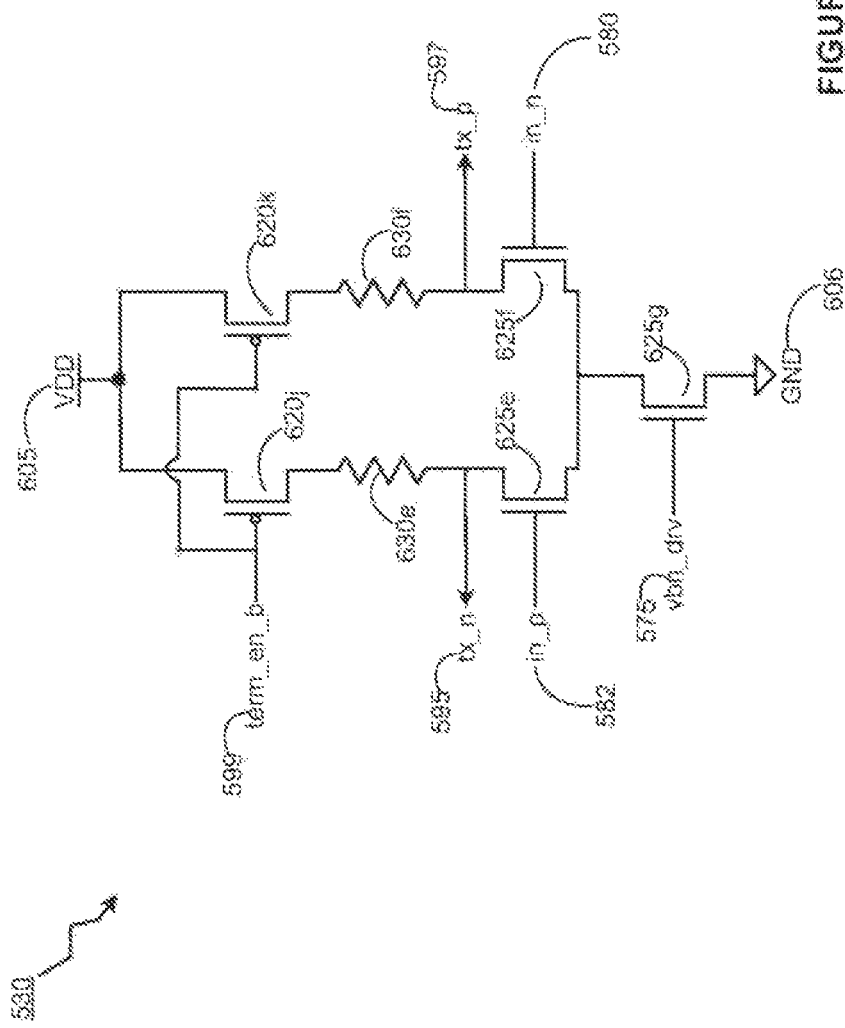

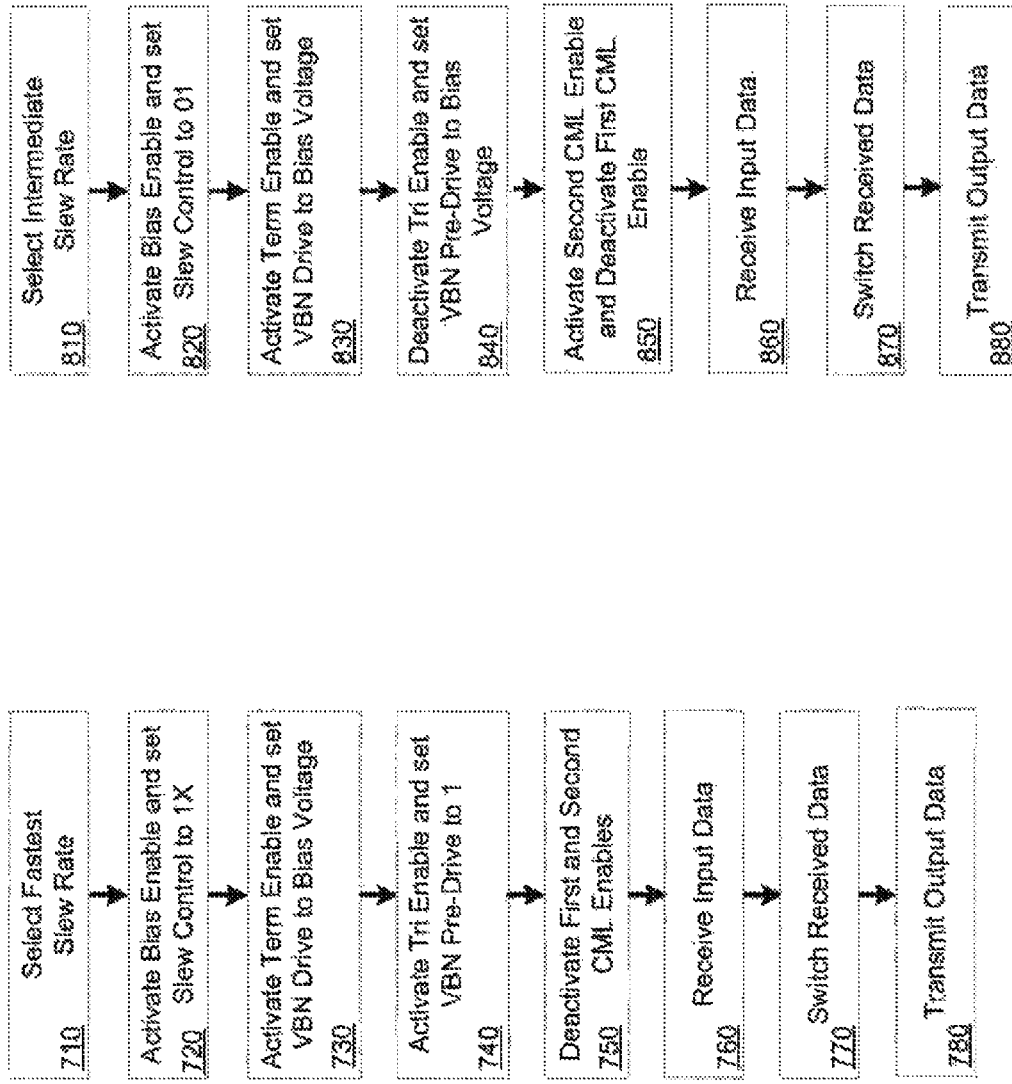

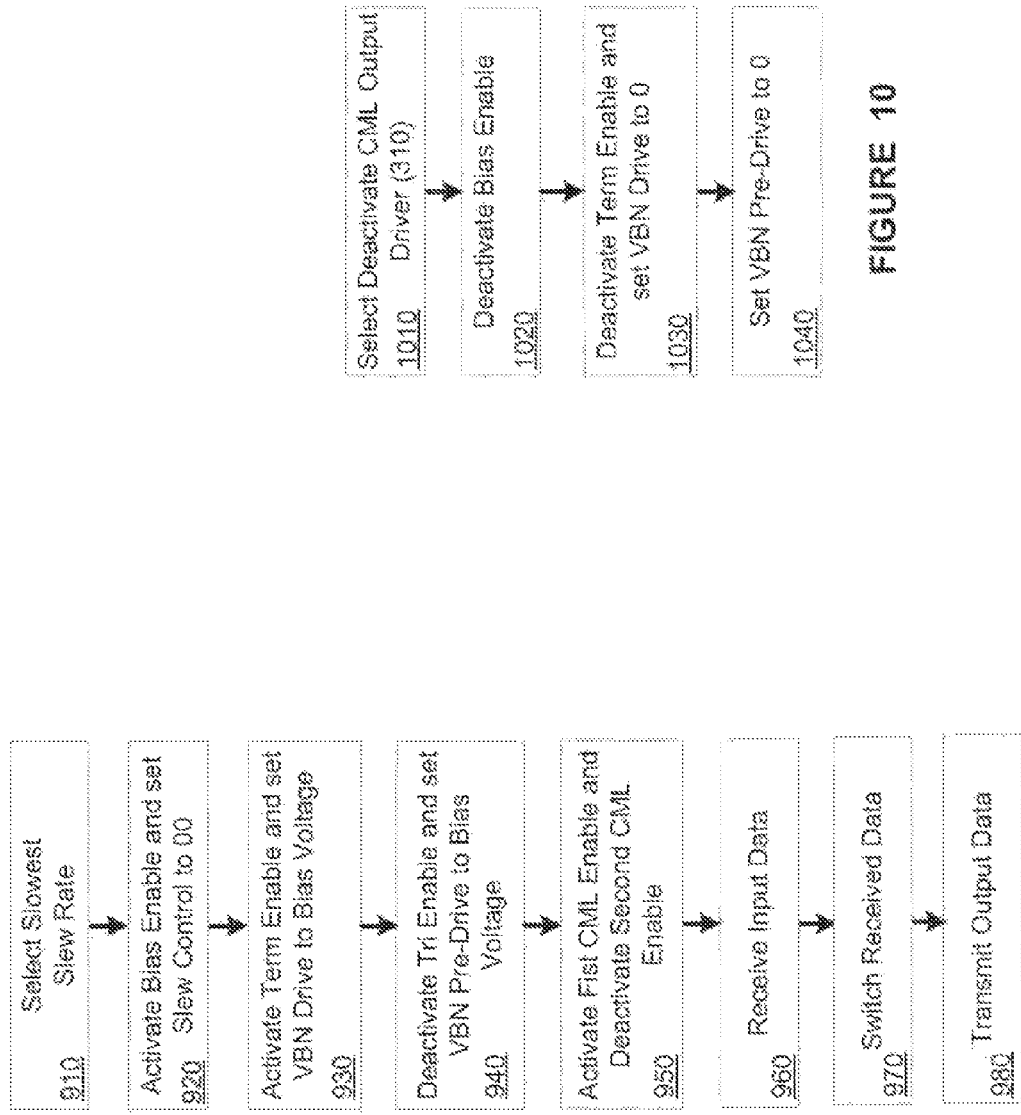

METHOD TO CONTROL SLEW RATE OF A CURRENT-MODE LOGIC OUTPUT DRIVER

CO-PENDING APPLICATIONS

The present application is a divisional application of U.S. patent application Ser. No. 13/114,479, entitled "CIRCUIT AND METHOD TO CONTROL SLEW RATE OF A CURRENT-MODE LOGIC OUTPUT DRIVER" and filed on May 24, 2011, the entirety of which is incorporated by reference herein.

BACKGROUND

1. Field of the Invention

Embodiments of this invention relate generally to electrical circuits and input/output ("I/O") interfaces, and, more particularly, to a method and driver circuit for controlling slew rates and power of current-mode logic ("CML") output drivers.

2. Description of Related Art

Electrical circuits and data storage devices have evolved becoming faster and transmitting greater amounts of data. With the increased speed and bandwidth capabilities of electrical circuits and data storage devices, I/O interfaces must be adapted to be compatible with new system requirements. As technologies for electrical circuits and data storage devices have progressed, there has developed a need for backward-compatibility with older and slower technologies, particularly in the area of I/O interfaces. However, power and signal speed considerations introduce substantial barriers to backward-compatibility for I/O interfaces. Parameters such as output voltage, skew and slew rate requirements are particularly problematic.

Typically, in modern implementations for I/O interfaces, either a voltage-mode differential pre-driver or a current-mode differential pre-driver drives a current-mode differential output driver. However, using either of these pre-drivers fails to provide a sufficient solution for backward-compatibility of I/O interfaces. State of the art voltage-mode pre-drivers have limited ranges for tuning slew rates and cannot simultaneously meet multiple, strict skew and slew rate requirements. State of the art current-mode pre-drivers are also incapable of successfully meeting multiple power requirements in conjunction with the necessary slew and skew considerations.

SUMMARY OF EMBODIMENTS OF THE INVENTION

In one aspect of the present invention, a method is provided. The method includes selecting, at a data transmission device, at least one of a plurality of slew rate control settings based at least upon a speed of data transmission and receiving input data at the data transmission device, wherein the input data is received at the data transmission speed. The method also includes switching the received input data in accordance with the selected at least one of a plurality of slew rate control settings and sending output data from the data transmission device at the data transmission speed.

In another aspect of the invention, a data driver device is provided. The data driver device includes at least one activation portion comprising one or more slew rate controls and a voltage-mode driver portion communicatively coupled to the at least one activation portion. The data driver device also includes at least a first current-mode driver portion communicatively coupled to the at least one activation portion.

In yet another aspect of the invention, a computer readable storage device encoded with data that, when implemented in a manufacturing facility, adapts the manufacturing facility to create an apparatus is provided. The apparatus includes a data driver device. The data driver device includes at least one activation portion comprising one or more slew rate controls and a voltage-mode driver portion communicatively coupled to the at least one activation portion. The data driver device also includes at least a first current-mode driver portion communicatively coupled to the at least one activation portion.

In yet another aspect of the invention, a system is provided. The system includes a data transmission apparatus, a data storage device communicatively coupled to the data transmission apparatus, and a processing device communicatively coupled to the data transmission apparatus. The data transmission apparatus includes at least one activation portion comprising one or more slew rate controls and a voltage-mode driver portion communicatively coupled to the at least one activation portion. The data transmission apparatus also includes a first current-mode driver portion communicatively coupled to the at least one activation portion and a second current-mode driver portion communicatively coupled to the at least one activation portion. The data transmission apparatus also includes an output data portion communicatively coupled to the voltage-mode driver portion and to the first and second current-mode driver portions.

BRIEF DESCRIPTION OF THE DRAWINGS

The invention may be understood by reference to the following description taken in conjunction with the accompanying drawings, in which the leftmost significant digit(s) in the reference numerals denote(s) the first figure in which the respective reference numerals appear, and in which:

FIG. 6C illustrates a schematic diagram of a portion of an input/output ("I/O") interface, according to one exemplary embodiment;

FIG. 7 illustrates a flowchart depicting control steps for selecting a fast configurable slew rate, according to one exemplary embodiment;

FIG. 8 illustrates a flowchart depicting control steps for selecting an intermediate configurable slew rate, according to one exemplary embodiment;

FIG. 9 illustrates a flowchart depicting control steps for selecting a slow configurable slew rate, according to one exemplary embodiment; and FIG. 10 illustrates a flowchart depicting deactivation of the CML output driver, according to one exemplary embodiment.

Figure 1:
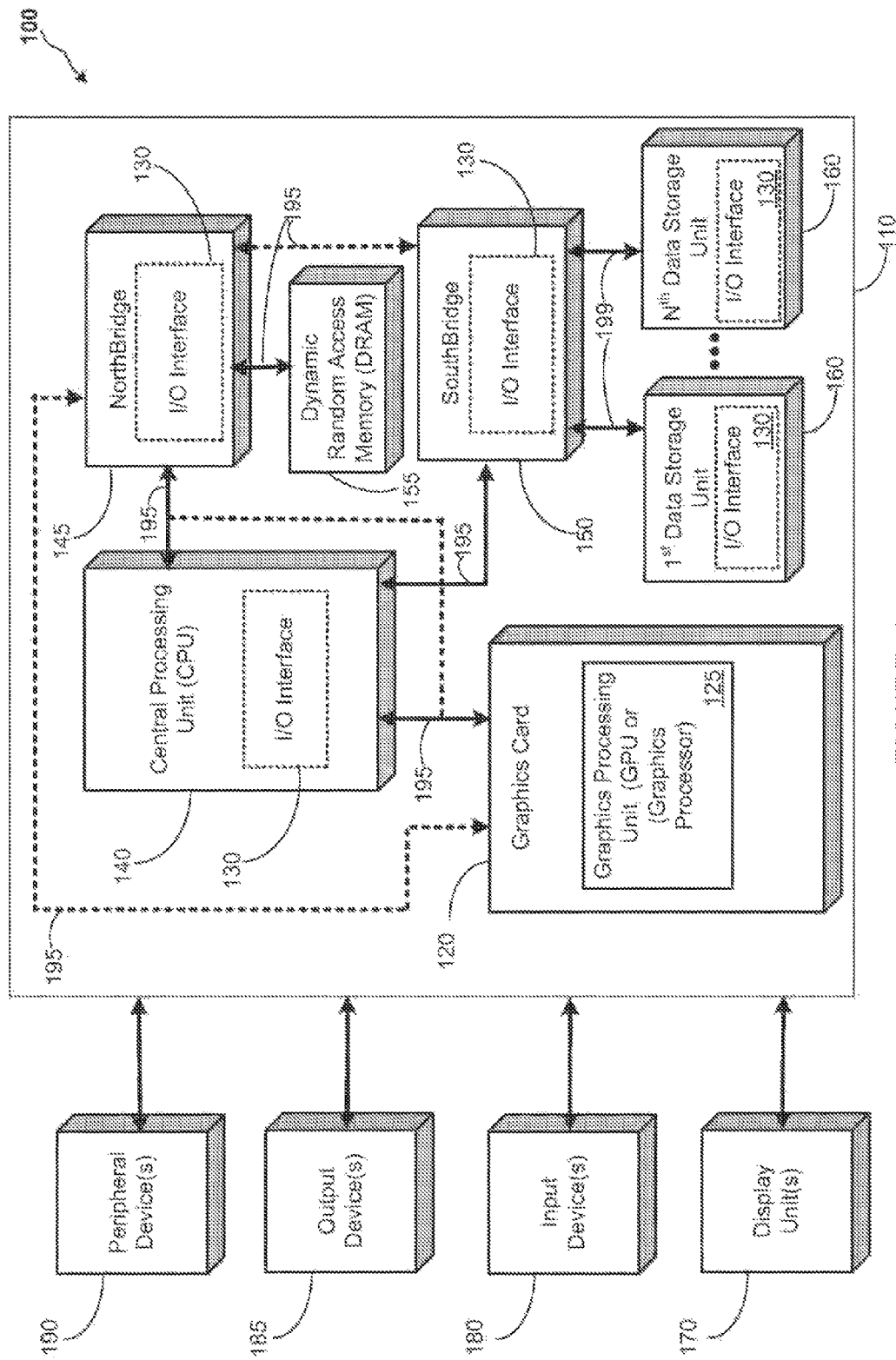
FIG. 1 schematically illustrates a simplified block diagram of a computer system including one or more I/O interfaces, according to one embodiment.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but, on the contrary, the intention is to cover all modifications, equivalents, and alternatives falling within the spirit and scope of the invention as defined by the appended claims.

DETAILED DESCRIPTION

Illustrative embodiments of the invention are described below. In the interest of clarity, not all features of an actual implementation are described in this specification. It will of course be appreciated that in the development of any such actual embodiment, numerous implementation-specific decisions may be made to achieve the developers' specific goals, such as compliance with system-related and business-related constraints, which may vary from one implementation to another. Moreover, it will be appreciated that such a development effort might be complex and time-consuming, but may nevertheless be a routine undertaking for those of ordinary skill in the art having the benefit of this disclosure.

Embodiments of the present invention will now be described with reference to the attached figures. Various structures, connections, systems and devices are schematically depicted in the drawings for purposes of explanation only and so as to not obscure the disclosed subject matter with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

As used herein, the suffix "_b" denotes a signal that is active-low (i.e., the signal is activated or enabled when a logical '0' is applied to the signal). Signals not having the "_b" suffix may be active-high (i.e., the signal is activated or enabled when a logical '1' is applied to the signal). While various embodiments and Figures herein are described in terms active-high and active-low signals, it is noted that such descriptions are for illustrative purposes of various embodiments and that alternate configurations are contemplated in other embodiments not explicitly described in this disclosure.

As used herein, the terms "substantially" and "approximately" may mean within 85%, 90%, 95%, 98% and/or 99%. In some cases, as would be understood by a person of ordinary skill in the art, the terms "substantially" and "approximately" may indicate that differences, while perceptible, may be negligent or be small enough to be ignored.

As used herein, the terms "data signal driver device" and "data transmission device" may be a current-mode output driver, a voltage- or current-mode pre-driver, an I/O interface, a central processing unit ("CPU"), a southbridge, a northbridge, a graphics processor unit ("GPU"), some combination thereof and/or the like, as would be understood by a person of ordinary skill in the art having the benefit of this disclosure.

Embodiments of the present invention generally provide for controlling slew rates and power of current-mode logic output drivers. It is contemplated that various embodiments described herein are not mutually exclusive. That is, the various embodiments described herein may be implemented simultaneously with, or independently of, each other, as would be apparent to one of ordinary skill in the art having the benefit of this disclosure. Various embodiments herein may be described in terms of serial advanced technology attachment ("SATA") I/O interfaces. However, it should be noted that such descriptions are used in order to provide a basis for illustration and understanding of the embodiments presented herein. That is, the embodiments provided in this disclosure are not limited to SATA, but rather may be applied to other I/O interfaces as would be apparent to one of ordinary skill in the art having the benefit of this disclosure.

High speed I/O interfaces, such as SATA, require their associated transmitter to meet very different rise and/or fall time parameters for different generations of the technologies (e.g., Gen1, Gen2, Gen3, etc.). In SATA, data rates for the different generations are as follows: Gen3, 6 Gb/s; Gen2, 3 Gb/s; and Gen1, 1.5 Gb/s. The generations of SATA must also meet strict differential skew parameters. For example, the rise/fall time requirements of SATA Gen3 are from 33 ps to 68 ps, SATA Gen2 is from 67 ps to 136 ps, and SATA Gen1 is from 100 ps to 237 ps. At Gen3 data rates, the transmitter power consumption may also becomes a concern, particularly when multiple lanes of transmitters are concurrently running at high speeds (e.g., high data rates). Therefore, it is difficult to save power at high data rates and simultaneously meet different rise/fall times and strict differential skew requirements at different data rates.

The embodiments described herein show a novel design that efficiently solves this problem. The embodiments described herein may use a pre-driver and an output driver, of which the pre-driver may be a dual-function voltage- and current-mode differential driver, and the output driver may be a current mode differential driver. The embodiments described herein may allow for power savings at high data rates while simultaneously meeting variable rise/fall times and strict differential skew requirements.

Turning now to FIG. 1, a block diagram of an exemplary computer system 100, in accordance with an embodiment of the present invention, is illustrated. In various embodiments the computer system 100 may be a personal computer, a laptop computer, a handheld computer, a mobile device, a telephone, a personal data assistant ("PDA"), a server, a mainframe, a work terminal, or the like. The computer system includes a main structure 110 which may be a computer motherboard, circuit board or printed circuit board, a desktop computer enclosure and/or tower, a laptop computer base, a server enclosure, part of a mobile device, personal data assistant (PDA), or the like. In one embodiment, the main structure 110 includes a graphics card 120. In one embodiment, the graphics card 120 may be a Radeon™ graphics card from Advanced Micro Devices ("AMD") or any other graphics card using memory, in alternate embodiments. The graphics card 120 may, in different embodiments, be connected on a Peripheral Component Interconnect "(PCI") Bus (not shown), PCI-Express Bus (not shown) an Accelerated Graphics Port ("AGP") Bus (also not shown), or any other connection known in the art. It should be noted that embodiments of the present invention are not limited by the connectivity of the graphics card 120 to the main computer structure 110. In one embodiment, computer runs an operating system such as Linux, Unix, Windows, Mac OS, or the like.

In one embodiment, the graphics card 120 may contain a graphics processing unit (GPU) 125 used in processing graphics data. The GPU 125, in one embodiment, may include one or more embedded memories (not shown). In one embodiment, the embedded memory(ies) may be an embedded random access memory ("RAM"), an embedded static random access memory ("SRAM"), or an embedded dynamic random access memory ("DRAM"). In one or more embodiments, the embedded memory(ies) may be an embedded RAM (e.g., an SRAM). In alternate embodiments, the embedded memory(ies) may be embedded in the graphics card 120 in addition to, or instead of, being embedded in the GPU 125. In various embodiments the graphics card 120 may be referred to as a circuit board or a printed circuit board or a daughter card or the like.

In one embodiment, the computer system 100 includes a central processing unit ("CPU") 140, which is connected to a northbridge 145. The CPU 140 and northbridge 145 may be housed on the motherboard (not shown) or some other structure of the computer system 100. It is contemplated that in certain embodiments, the graphics card 120 may be coupled to the CPU 140 via the northbridge 145 or some other connection as is known in the art. For example, CPU 140, northbridge 145, GPU 125 may be included in a single package or as part of a single die or "chips" (not shown). Alternative embodiments which alter the arrangement of various components illustrated as forming part of main structure 110 are also contemplated. The CPU 140 and/or the northbridge 145, in certain embodiments, may each include one or more I/O interfaces 130. In certain embodiments, the northbridge 145 may be coupled to a system RAM (or DRAM) 155; in other embodiments, the system RAM 155 may be coupled directly to the CPU 140. The system RAM 155 may be of any RAM type known in the art; the type of RAM 155 does not limit the embodiments of the present invention. In one embodiment, the northbridge 145 may be connected to a southbridge 150. In other embodiments, the northbridge 145 and southbridge 150 may be on the same chip in the computer system 100, or the northbridge 145 and southbridge 150 may be on different chips. In one embodiment, the southbridge 150 may have one or more I/O interfaces 130, in addition to any other I/O interfaces 130 elsewhere in the computer system 100. In various embodiments, the southbridge 150 may be connected to one or more data storage units 160 using a data connection or bus 199. The data storage units 160 may be hard drives, solid state drives, magnetic tape, or any other writable media used for storing data. In one embodiment, one or more of the data storage units may be SATA data storage units and the data connection 199 may be a SATA bus/connection. Additionally, the data storage units 160 may contain one or more I/O interfaces 130. In various embodiments, the central processing unit 140, northbridge 145, southbridge 150, graphics processing unit 125, DRAM 155 and/or embedded RAM may be a computer chip or a silicon-based computer chip, or may be part of a computer chip or a silicon-based computer chip. In one or more embodiments, the various components of the computer system 100 may be operatively, electrically and/or physically connected or linked with a bus 195 or more than one bus 195.

In different embodiments, the computer system 100 may be connected to one or more display units 170, input devices 180, output devices 185 and/or other peripheral devices 190. It is contemplated that in various embodiments, these elements may be internal or external to the computer system 100, and may be wired or wirelessly connected, without affecting the scope of the embodiments of the present invention. The display units 170 may be internal or external monitors, television screens, handheld device displays, and the like. The input devices 180 may be any one of a keyboard, mouse, track-ball, stylus, mouse pad, mouse button, joystick, scanner or the like. The output devices 185 may be any one of a monitor, printer, plotter, copier or other output device. The peripheral devices 190 may be any other device which can be coupled to a computer: a CD/DVD drive capable of reading and/or writing to corresponding physical digital media, a universal serial buss ("USB") device, Zip Drive, external floppy drive, external hard drive, phone and/or broadband modem, router/gateway, access point and/or the like. To the extent certain exemplary aspects of the computer system 100 are not described herein, such exemplary aspects may or may not be included in various embodiments without limiting the spirit and scope of the embodiments of the present invention as would be understood by one of skill in the art.

Figure 2:
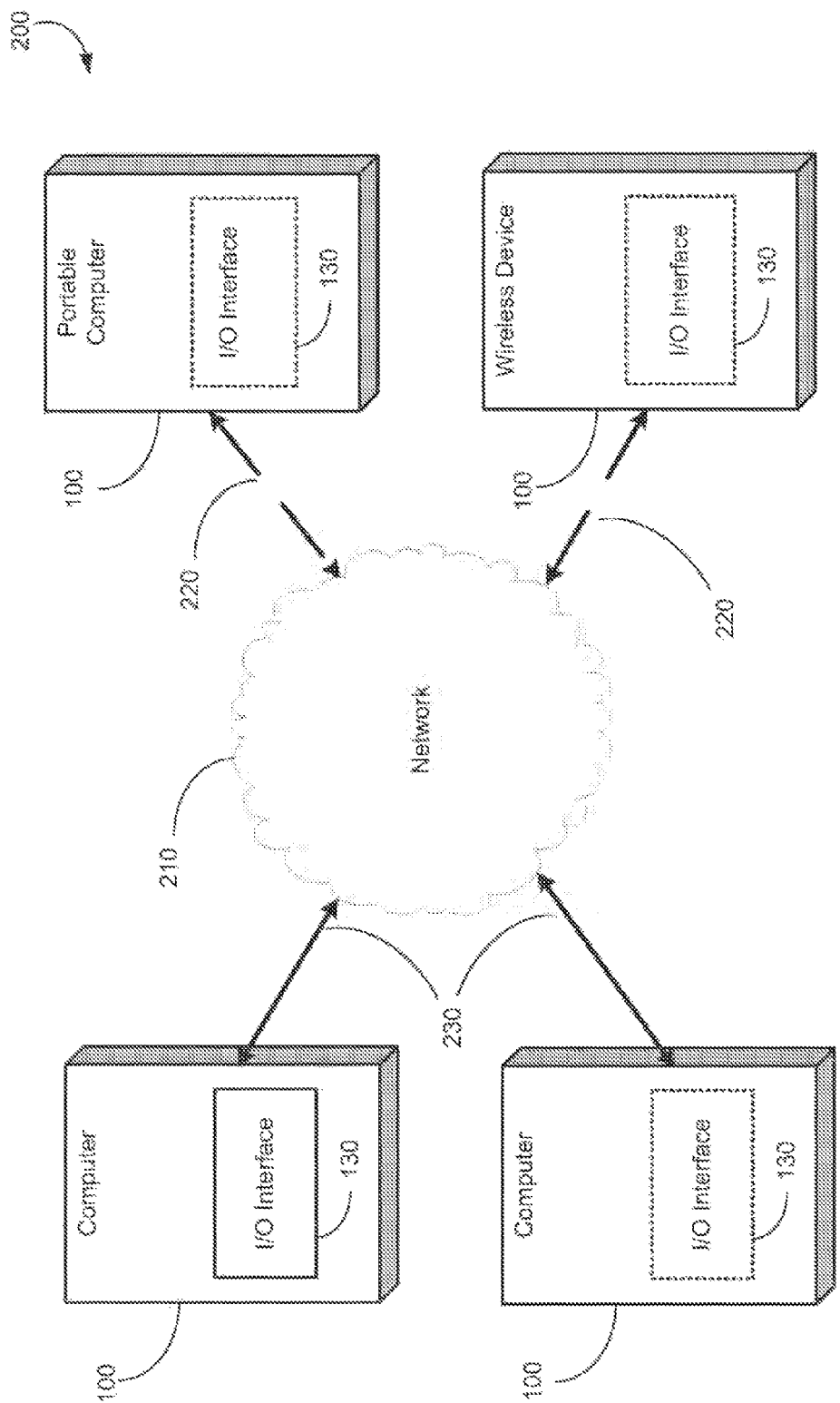
FIG. 2 shows a simplified block diagram of multiple computer systems connected via a network, according to one embodiment.

Turning now to FIG. 2, a block diagram of an exemplary computer network 200, in accordance with an embodiment of the present invention, is illustrated. In one embodiment, any number of computer systems 100 may be communicatively coupled and/or connected to each other through a network infrastructure 210. In various embodiments, such connections may be wired 230 or wireless 220 without limiting the scope of the embodiments described herein. The network 200 may be a local area network ("LAN"), wide area network ("WAN"), personal network, company intranet or company network, the Internet, or the like. In one embodiment, the computer systems 100 connected to the network 200 via network infrastructure 210 may be a personal computer, a laptop computer, a handheld computer, a mobile device, a telephone, a personal data assistant ("PDA"), a server, a mainframe, a work terminal, or the like. One or more computer systems 100 may, in various embodiments, contain one or more I/O interfaces 130. The number of computers depicted in FIG. 2 is exemplary in nature; in practice any number of computer systems 100 maybe coupled/connected using the network 200.

Figure 3:
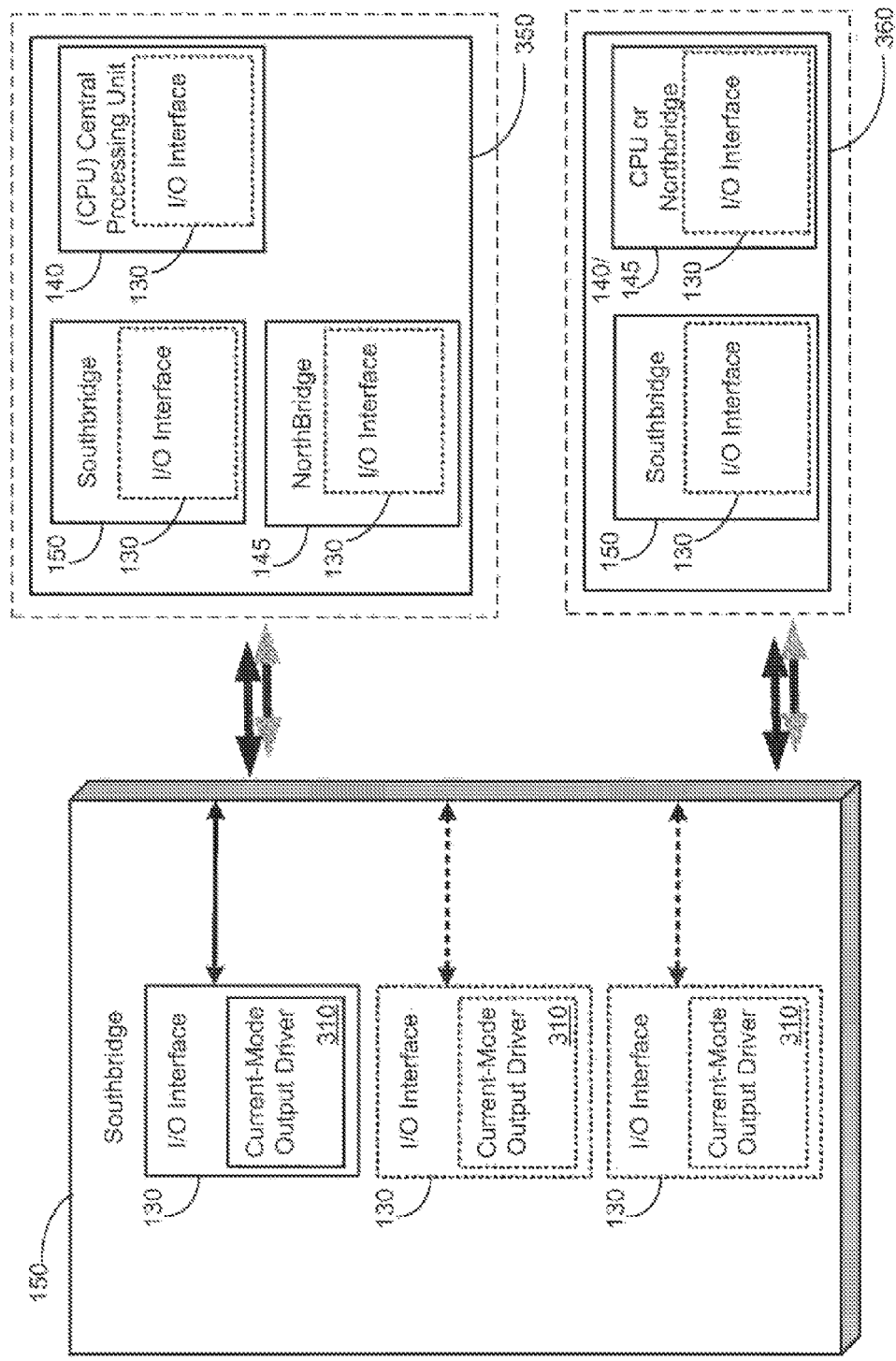
FIG. 3 provides a more detailed representation of one embodiment of a southbridge in the computer system provided in FIG. 1.

Turning now to FIG. 3, a block diagram of an exemplary southbridge 150, in accordance with an embodiment of the present invention, is illustrated. In one embodiment, the southbridge 150 may contain one or more I/O interfaces 130 used in controlling data transmissions between the data storage units 160 and the rest of the computer system 100. The southbridge 150, in one embodiment as shown, may include an I/O interface(s) comprising a current-mode output driver 310. In one embodiment, the current-mode output driver 310 may contain control logic, described in further detail below. To the extent certain exemplary aspects of the southbridge 150 are not described herein, such exemplary aspects may or may not be included in various embodiments without limiting the spirit and scope of the embodiments of the present invention as would be understood by one of skill in the art. For example, data storage units may be connected to various parts of the computer system 100 via external SATA ("eSATA"), USB, Firewire, advanced technology attachment ("ATA"), parallel ATA ("PATA"), integrated drive electronics ("IDE"), extended IDE ("EIDE"), connections and/or the like. Additionally, the southbridge 150 may contain I/O interfaces 130 adapted to perform I/O processes for different connection standards.

Referring still to FIG. 3, in one embodiment, the southbridge 150 and I/O interface(s) 130 may reside on the same silicon chip 350 as the CPU 140 and northbridge 145. In one alternate embodiment, the southbridge 150 and I/O interface(s) 130 may reside on the same silicon chip 360 as the CPU 140. In such embodiments, the silicon chip(s) 350/360 may be used in a computer system 100 in place of, or in addition to, the southbridge 150. The silicon chip(s) 350/360 may be housed on the motherboard (not shown) or other structure of the computer system 100.

Figure 4:
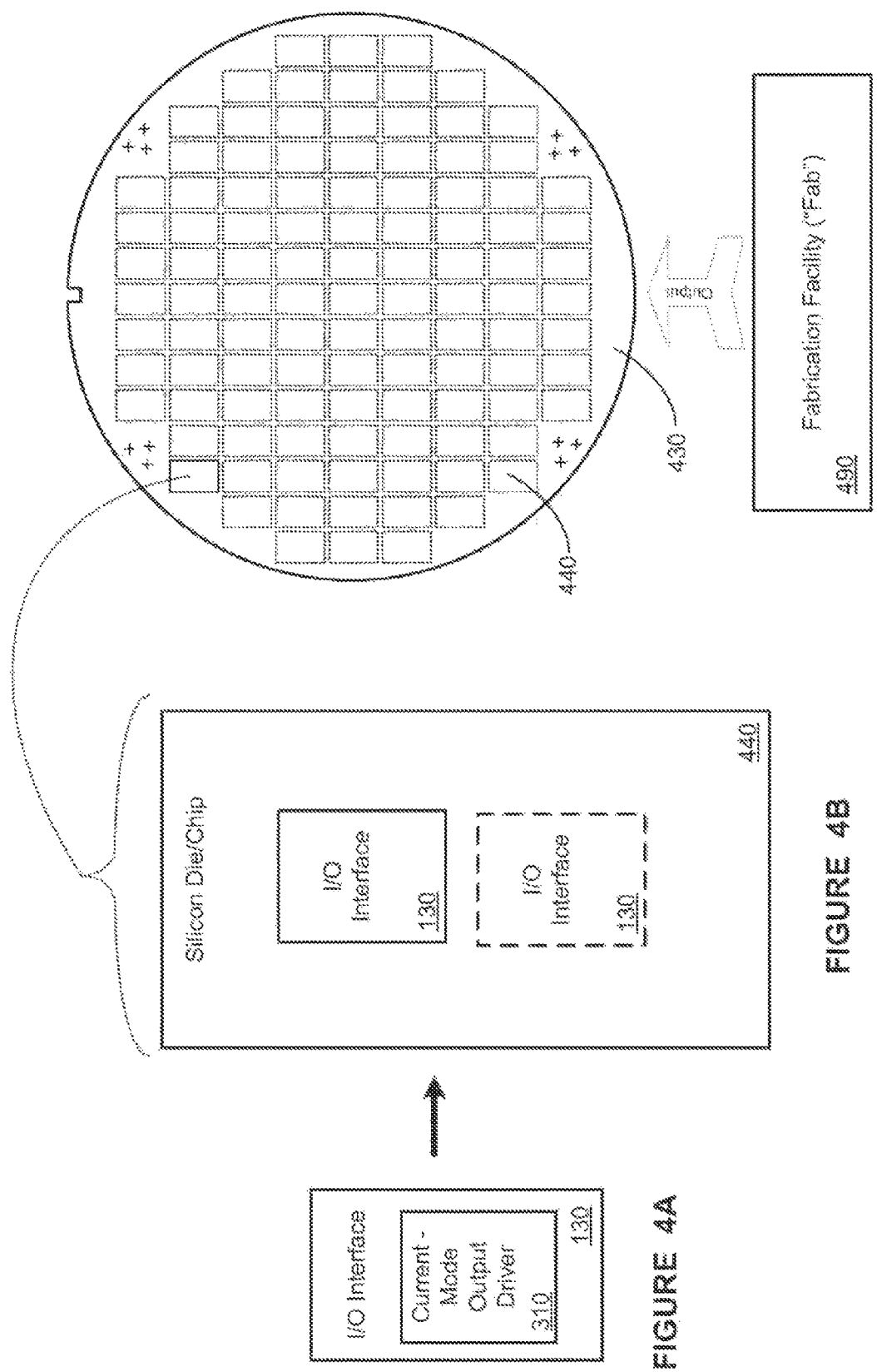
FIG. 4A illustrates an exemplary detailed representation of an input/output ("I/O") interface that is provided in FIGS. 1-3 according to one embodiment.
FIG. 4B illustrates a silicon die/chip as the input/output ("I/O") interface that is provided in FIGS. 1-3 according to one embodiment.
FIG. 4C illustrates one or more of the silicon die/chips that is provided in FIG. 4B as a silicon wafer according to one embodiment.

Turning now to FIG. 4A, a simplified, exemplary representation of the I/O interface 130, and, according to one or more embodiments, a current-mode output driver, which may be used in silicon die/chips 440, as well as devices depicted in FIGS. 1-3, according to various embodiments, is illustrated. However, those skilled in the art will appreciate that the I/O interface 130 may take on any of a variety of forms, including those previously described above, without departing from the spirit and scope of the instant invention. The I/O interface 130 may be implemented as single elements (130) or in groups of logic (not shown).

Turning to FIG. 4B, the silicon die/chip 440 is illustrated as one or more I/O interfaces 130, or any other configuration of the I/O interface as would be apparent to one of skill in the art having the benefit of this disclosure. As discussed above, various embodiments of the I/O interface 130 may be used in a wide variety of electronic devices, including, but not limited to, southbridge devices, central processing units, northbridge devices, motherboards, graphics cards, combinatorial logic implementations, stand-alone controllers, other integrated circuits (ICs), or the like.

Turning now to FIG. 4C, in accordance with one embodiment, and as described above, one or more of the I/O interfaces 130 may be included on the silicon die/chips 440 (or computer chip). The silicon die/chips 440 may contain one or more different configurations of the I/O interfaces 130 (e.g., I/O interfaces 130 configured to perform according to one or more connection standards, such as SATA). The silicon chips 440 may be produced on a silicon wafer 430 in a fabrication facility (or "fab") 490. That is, the silicon wafers 430 and the silicon die/chips 440 may be referred to as the output, or product of, the fab 390. The silicon die/chips 440 may be used in electronic devices, such as those described above in this disclosure.

Figure 5:
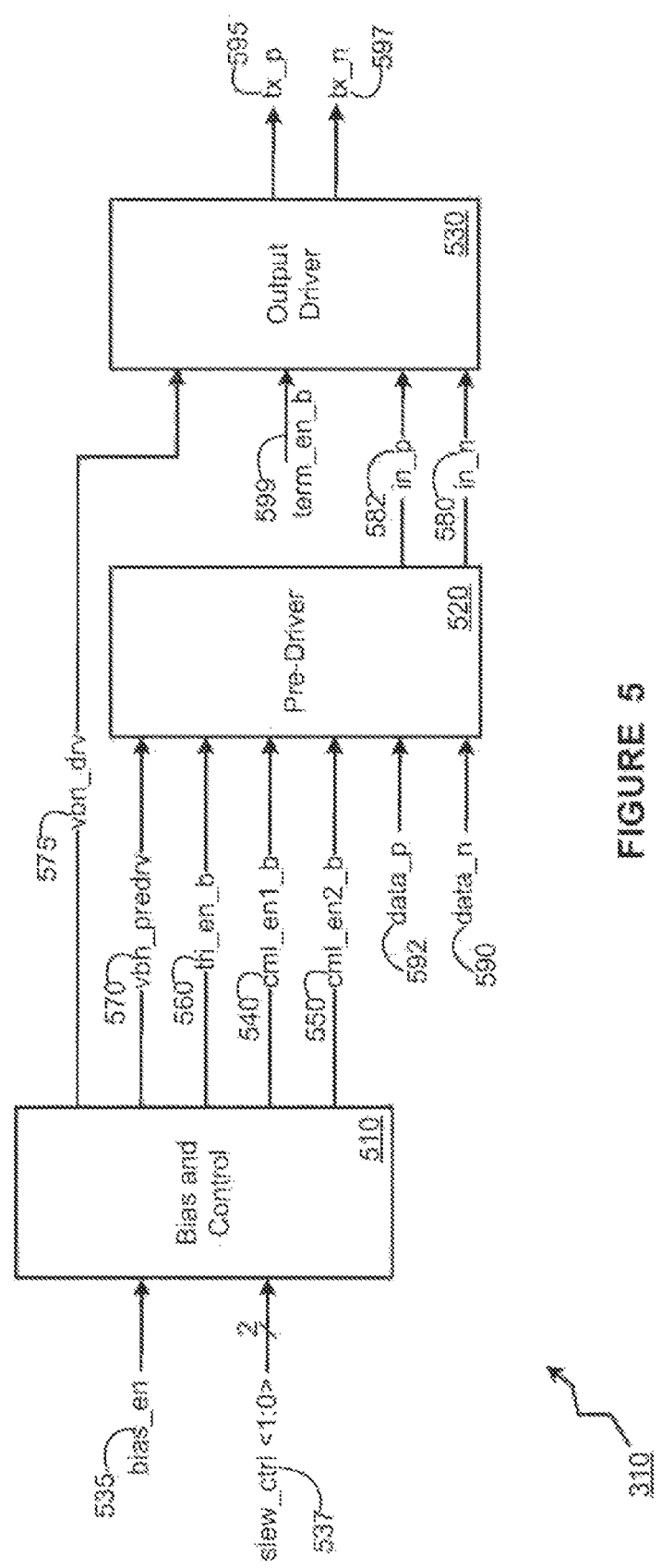
FIG. 5 illustrates a schematic diagram of an input/output ("I/O") interface, according to one exemplary embodiment.

Turning now to FIG. 5, a diagram of an exemplary implementation of a portion of the I/O interface 130 is illustrated, according to one embodiment. As previously described, in one or more embodiments, the I/O interface 130 may contain a current-mode output driver 310. As shown in FIG. 5, the current-mode output driver 310 may be implemented in one or more portions (e.g., a bias and control block 510 portion, a pre-driver block 520 portion and/or an output driver block 530 portion), or may be implemented as one logical block. It should be noted that in various embodiments shown in the Figures and described herein, the current-mode output driver 310 may be implemented in a bias and control 510 portion, a pre-driver 520 portion and/or an output driver 530 portion for purposes of illustration and conceptualization, however any configuration and/or partitioning of the current-mode output driver 310 may be used in accordance with the embodiments herein.

The bias and control block 510 may act, in some embodiments, as, or as part of, an activation element. The activation element may include signals and/or hardware components to enable/disable various circuits and components. The current-mode output driver 310 may have a bias enable signal bias_en 535 and a slew control input slew_ctrl 537. The slew_ctrl 537 may comprise one or more bits. In one embodiment, the slew_ctrl 537 may comprise two bits [1:0] in order to provide four possible slew rate control settings, configurations and/or modes. The bias and control block 510 may use the bias_en 535 and the slew_ctrl 537 to determine one or more output signals. The output signals from the bias and control block 510 may be, according to one or more embodiments but not limited thereto, a pre-driver vbn_predrv 570, a driver vbn_drv 575, a tristate enable tri_en_b 560, a first CML enable cml_en1_b 540, and a second CML enable cml_en2_b 550. The outputs of the bias and control 510 may be input into pre-driver 520 and/or to the output driver 530. In one embodiment, the vbn_dry 575 may be used as an input to the output driver 530, while the vbn_predrv 570, the enable tri_en_b 560, the cml_en1_b 540, and the cml_en2_b 550 may be used as inputs to the pre-driver 520.

The pre-driver 520 may be a dual-function voltage and current mode differential pre-driver. That is, in different modes of operation, the pre-driver may act as a voltage-mode driver and/or a current-mode driver. The pre-driver 520 may also take as an input a differential (or high-speed, differential) data signal comprised of a data_n 590 signal and a data_p 592 signal. The differential data signal may be the data to be transmitted to and/or from the storage device units 160. The pre-driver 520 may, in one or more embodiments, be adapted to act as a first-stage driver to propagate the data_n 590 and the data_p 592 signals to the output driver 530 in the form of signals in_n 580 and in_p 582. The pre-driver 520 may use the signals input to the pre-driver 520 to determine the slew rate, skew and/or power used for outputting the signals data_n 590 and data_p 592 to the output driver 530 in the form of the signals in_n 580 and in_p 582. In one or more embodiments, it may be desired to conform to different data transmissions standards, such as, but not limited to, Gen1, Gen2 and/or Gen3 of the SATA transmission standard. The pre-driver 520 may determine, based at least in part on its input signals, which generation's speed, skew, slew rate and power should be used to transmit data on the in_n 580 and in_p 582 signal lines.

The output driver 530 may, in one or more embodiments and as previously described, take the signals in_n 580 and in_p 582 (i.e., the propagated data_n 590 and data_p 592 signals from the pre-driver 520) as inputs. The output driver may also take the driver signal vbn_drv 575 and the enable signal term_en_b 599 as inputs. The output driver 530 may, based upon its inputs, transmit (or drive as outputs) the in_n 580 and in_p 582 signals in the form of a tx_n 595 signal and a tx_p 597 signal (i.e., an output pair of differential data signals).

Figure 6A:
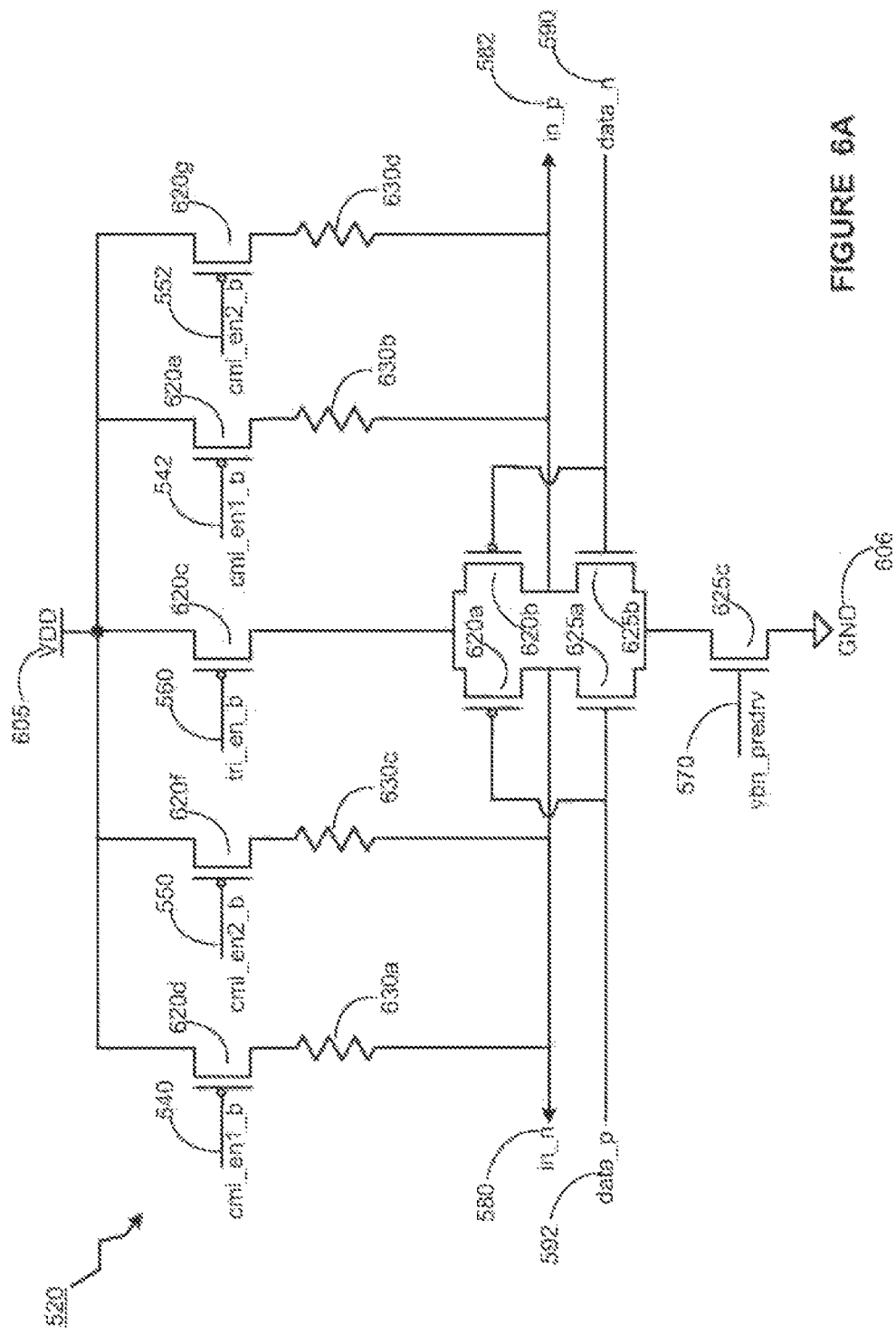
FIG. 6A illustrates a schematic diagram of a portion of an input/output ("I/O") interface, according to one exemplary embodiment.

Turning now to FIG. 6A, in accordance with one or more embodiments of the present invention, an exemplary implementation of a portion of the I/O interface 130 (i.e., pre-driver 520) is illustrated. As shown in FIG. 6A, the pre-driver 520 may consist of various circuit components such as, but not limited to, metal oxide semiconductor field effect transistors ("MOSFETs"), resistors, power node(s) and ground node(s). The MOSFETs may be n-type (nFET) or p-type (pFET), as would be known to a person of ordinary skill in the art. Similarly, the power nodes may be of an implementation specific and/or variable voltage level, as would be known to a person of ordinary skill in the art. The pre-driver 520 may have as data input signals the data_n 590 and the data_p 592 and may output data signals in_n 580 and in_p 582.

The pre-driver 520 may be illustratively described in four parts for the purposes of understanding and conceptualization. The pre-driver 520 may comprise a driver portion that may include pFETs 620a-b and nFETs 625a-c. The source of each of the pFETs 620a-b may be connected together and to the drain of a pFET 620c. The drain of the pFET 620a may be connected to the drain of the nFET 625a and to the in_p 582, and the gate of the pFET 620a may be connected to the data_p 592. The drain of the pFET 620b may be connected to the drain of the nFET 625a and to the in_n 580, and the gate of the pFET 620b may be connected to the data_n 590. The source of each of the nFETs 625a-b may be connected together and to the drain of an nFET 625c. The drain of the nFET 620a may be connected to the drain of the pFET 620a and to the in_n 580, and the gate of the nFET 625a may be connected to the data_p 592. The drain of the nFET 625b may be connected to the drain of the pFET 620a and to the in_p 582, and the gate of the nFET 625b may be connected to the data_n 590. The nFET 625c may have its source connected to a ground node 606 and its gate connected to the vbn_predrv 582.

The pre-driver 520 may also include a tristate enable portion comprising the pFET 620c. The pFET 620c may have its drain connected to the drain of each of the pFETs 620a-b, and may have its source connected to a power node VDD 605. The pFET 620c may have its gate connected to the tri_en_b 560.

The pre-driver 520 may also include a first CML enable portion comprising pFETs 620d-e and resistors 630a-b. The pFETs 620d-e may each have their source connected to the VDD 605, and may each have their gate connected to the cml_en1_b 540. The drain of the pFET 620d may be connected to the first side of resistor 630a, and the drain of the pFET 620e may be connected to the first side of resistor 630b. The resistors 630a-b may each have their second side connected to the in_n 580. In one embodiment, the pFET 620d and the pFET 620e correspond to the differential signals in_n 580 and in_p 582 respectively. In one embodiment, the pFET 620d and the pFET 620e may each be described as a differential signal path.

The pre-driver 520 may also include a second CML enable portion comprising pFETs 620f-g and resistors 630c-d. The pFETs 620f-g may each have their source connected to the VDD 605, and may each have their gate connected to the cml_en2_b 540. The drain of the pFET 620f may be connected to the first side of resistor 630c, and the drain of the pFET 620g may be connected to the first side of resistor 630d. The resistors 630c-d may each have their second side connected to the in_p 582. In one embodiment, the pFET 620f and the pFET 620g correspond to the differential signals in_n 580 and in_p 582 respectively. In one embodiment, the pFET 620f and the pFET 620g may each be described as a differential signal path.

The voltage-mode differential driver portion of the pre-driver 520 may include pFETs 620a-c and nFETs 625a-c. The current-mode differential driver portion of the pre-driver 520 may include pFETs 620d-g and nFETs 625a-c as well as the resistors 630a-d. The pFETs 620d-e may be a first current mode portion and the pFETs 620f-g may be a second current mode portion. In one embodiment, the resistors 630a-b may be of an equal resistance value r1, and the resistors 630c-d may be of an equal resistance value r2. In various embodiments, the value r1 is greater than value r2 (i.e., r1>r2). The resistors 630a-d may be configured, in various embodiments, to provide matched impedance values for each of the pre-driver 520 portions described above. In one embodiment, the resistors 630a-b may each have a resistance value of 2 k ohms and the resistors 630c-d may each have resistance values of 1 k ohms. In one embodiment, multiple "slices" of identical pre-driver 520 circuits may be implemented to switch/drive data signals to the output driver 530. Such implementations may affect the overall, effective impedance value across the multiple pre-driver 520 slices. For example, if 13 "slices" are used in one embodiment, the total equivalent resistance of multiple instances of resistors 630a-b may be 2 kΩ divided by 13 (i.e., 2 kΩ/13) or approximately 154Ω, and the total equivalent resistance of multiple instances of resistors 630c-d may be 1 kΩ divided by 13 (i.e., 1 kΩ/13) or approximately 77 Ω.

The nFET 625c may have dual functions: (1) In the voltage-mode differential drive function, the nFET 625c may turn on as a switch allowing current to flow between the GND 606 and each source of the nFETs 625a-b; (2) In the current-mode driver function, nFET 625c may supply tail current to the source coupled current-mode driver.

Figure 6B:
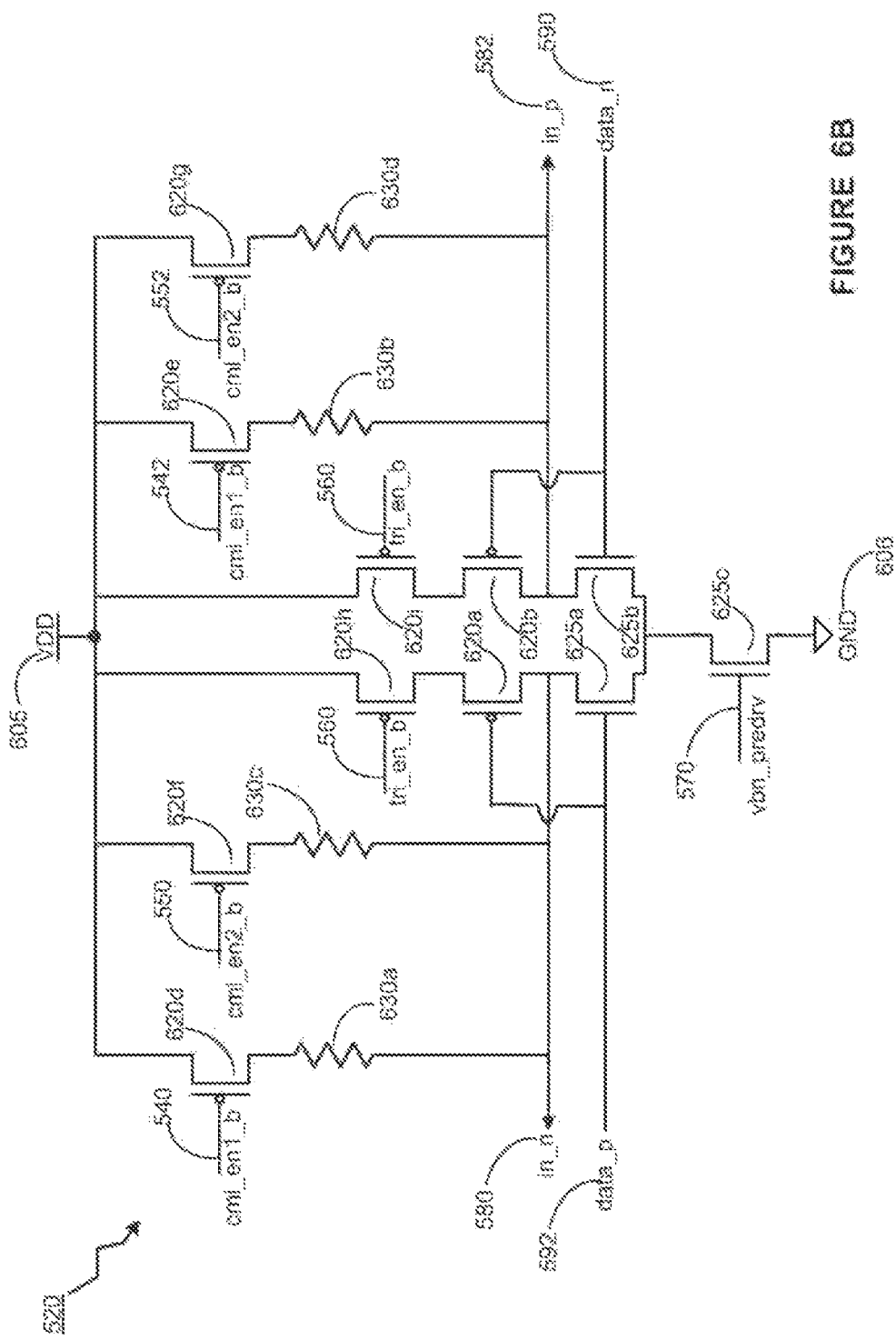
FIG. 6B illustrates a schematic diagram of a portion of an input/output ("I/O") interface, according to one exemplary embodiment.

Turning now to FIG. 6B, in accordance with one or more embodiments of the present invention, an alternate exemplary implementation of a portion of the I/O interface 130 (i.e., the pre-driver 520) is illustrated. FIG. 6B depicts the tristate portion of the pre-driver 520, as shown in FIG. 6A, as including two pFETs 620h-i, each with their respective source connected to the power node VDD 605 and each with their respective gate connected to the tri_en_b 560, in contrast to the single pFET 620c shown in FIG. 6A. The drain of the pFET 620h may be connected to the source of the pFET 620a, and the drain of the pFET 620i may be connected to the source of the pFET 620b. In the alternate configuration shown in FIG. 6B, the source of each pFET 620a-b are not connected together; rather, the source of each pFET 620a-b are connected to the VDD 605 via the pFETs 620h-i respectively instead of through the single pFET 620c component as shown in FIG. 6A. The remaining configurations shown in FIG. 6B correspond to the configurations described above with respect to FIG. 6A.

Turning now to FIG. 6C, in accordance with one or more embodiments of the present invention, an exemplary implementation of a portion of the I/O interface 130 (i.e., output driver 530) is illustrated. As shown in FIG. 6C, the output driver 530 may consist of various circuit components such as, but not limited to, MOSFETs, resistors, power node(s) and ground node(s). The MOSFETs may be n-type (nFET) or p-type (pFET), as would be known to a person of ordinary skill in the art. Similarly, the power nodes may be of an implementation specific and/or variable voltage level, as would be known to a person of ordinary skill in the art. The output driver 530 may have as data input signals the in_n 580 and the in_p 582 and may output data signals tx_n 595 and tx_p 597.

The output driver 530 may include pFETs 620j-k, nFETs 625e-g and resistors 630e-f. The pFETs 620j-k may each have their respective source connected to the VDD 605, and may each have their respective gate connected to the term_en_b 599. The pFET 620j may have its drain connected to the first side of the resistor 630e, and the pFET 620k may have its drain connected to the first side of the resistor 630f. The resistor 630e may have its second side connected to the signal tx_n 595 and to the drain of the nFET 625e. The resistor 630f may have its second side connected to the signal tx_p 597 and to the drain of the nFET 625f. The nFETs 625e-f may each have their respective source connected together and connected to the drain of the nFET 625g. The nFET 625e may have its gate connected to the in_p 582, and the nFET 625f may have its gate connected to the in_n 580. The nFET 625g may have its source connected to the GND 606 and its gate connected to the vbn_drv 575.

The resistors 630*e-f* may be configured, in various embodiments, to provide matched impedance values for the output driver 530. In various embodiments, the impedance values may be match according to one or more data transmission standards (e.g., SATA). In one embodiment, the resistor 630*e* may have a resistance value such that the overall, total resistance for the resistor 630*e* and the pFET 620*j* is approximately 50Ω. Similarly, the resistor 630*f* may have a resistance value such that the overall, total resistance for the resistor 630*f* and the pFET 620*k* is approximately 50Ω. The resistance values for the resistors 630*e-f* may be automatically calibrated by one or more on-chip impedance calibration circuits (not shown). It is contemplated that other values may be used in accordance with various data transmission standards without departing from the spirit and scope of the embodiments described herein.

With respect to FIGS. 7-10 and in accordance with one or more embodiments, flowcharts depicting slew rate, rise/fall time and power control are shown. In one or more embodiments, the slew rate of the I/O interface 130 with the current mode logic output driver 310 may be controlled in the following ways.

Turning to FIG. 7, a flowchart depicting control for the fastest configurable slew rate is shown, in accordance with one or more embodiments. For purposes of this description, it is assumed that a digital signal 0 equals 0V (i.e., GND 606) and a digital signal 1 equals VDD 605. At step 710, the fastest slew rate is selected. For the fastest slew rate (e.g., for Gen3 SATA), the bias and control block 510 may turn on the pre-driver 520 to be a voltage-mode differential driver. Such a configuration may save power because a voltage-mode differential driver uses less power than a current-mode differential driver. A voltage-mode differential driver may be configured by setting the following signals. For the bias and control 510, the bias_en 535 may be set to 1 and the slew_ctrl<1:0> 537 may be set to 1x (where 'x' means either 1 or 0) (at step 720). The term_en_b 599 may be set to 0, the vbn_drv 575 may be set to bias voltage for the output driver 530 (at step 730). For the pre-driver 520, the vbn_predrv 570 may be set to 1 and tri_en_b 560 may be set to 0 (at step 740), the cml_en1_b 540 may be set to 1, and the cml_en2_b 550 may be set to 1 (at step 750). As such, the nFET 625*c* and the pFET 620*c* switch on while pFETs 620*d-g* switch off. In this configuration, the pre-driver 520 output signals in_n 580 and in_p 582 may have the fastest configurable slew rate and the output driver 530 output signals tx_n 595 and tx_p 597 may have the fastest configurable rise/fall time. Input data may be received (at step 760), may be switched and/or driven at the fastest slew rate (step 770), and may be transmitted or driven as output (step 780). It is contemplated that the steps as shown in FIG. 7 are not limited to the order in which they are described above. In accordance with one or more embodiments, the steps shown in FIG. 7 may be performed sequentially, in parallel, or in alternate order(s) without departing from the spirit and scope of the embodiments presented herein.

Turning to FIG. 8, a flowchart depicting control for the intermediate configurable slew rate is shown, in accordance with one or more embodiments. For purposes of this description, it is assumed that a digital signal 0 equals 0V (i.e., GND 606) and a digital signal 1 equals VDD 605. At step 810, the intermediate slew rate is selected. For the intermediate slew rate (e.g., for Gen2 SATA), the bias and control block 510 may turn on the pre-driver 520 to be a current-mode differential driver. For example, the bias_en 535 may be set to 1 and the slew_ctrl<1:0> 537 may be set to 01 (at step 820) for the bias and control 510. For the output driver 530, the term_en_b 599 may be set to 0 and the vbn_drv 575 may be set to bias voltage (step 830). For the pre-driver 520, the vbn_predrv 570 may be set to bias voltage and the tri_en_b 560 may be set to 1 (step 840), while the cml_en1_b 540 may be set to 1, and the cml_en2_b 550 may be set to 0 (at step 850). In this configuration, the pFETs 620*f-g* switch on and the pFETs 620*c-e* switch off. The nFET 625*c* turns on and generates a tail current for the current-mode pre-driver. Current is allowed to flow through the relatively smaller impedance resistors 630*c-d*. In this configuration the pre-driver 520 output signals in_n 580 and in_p 582 may have the configurable intermediate slew rate, and the output driver 530 output signal tx_n 595 and tx_p 597 may have the configurable intermediate rise/fall time. Input data may be received (at step 860), may be switched and/or driven at the intermediate slew rate (step 870), and may be transmitted or driven as output (step 880). It is contemplated that the steps as shown in FIG. 8 are not limited to the order in which they are described above. In accordance with one or more embodiments, the steps shown in FIG. 8 may be performed sequentially, in parallel, or in alternate order(s) without departing from the spirit and scope of the embodiments presented herein.

Turning to FIG. 9, a flowchart depicting control for the slowest configurable slew rate is shown, in accordance with one or more embodiments. For purposes of this description, it is assumed that a digital signal 0 equals 0V (i.e., GND 606) and a digital signal 1 equals VDD 605. At step 910, the slowest slew rate is selected. For the slowest slew rate (e.g., for Gen1 SATA), the bias and control block 510 may turn on the pre-driver 520 to be a current-mode differential driver. For example, the bias_en 535 may be set to 1 and the slew_ctrl<1:0> 537 may be set to 00 (step 920) for the bias and control 510. For the output driver 530, the term_en_b 599 may be set to 0 and the vbn_drv 575 may be set to bias voltage (step 930). For the pre-driver 520, the vbn_predrv 570 may be set to bias voltage and the tri_en_b 560 may be set to 1 (step 940), while the cml_en1_b 540 may be set to 0 and the cml_en2_b 550 may be set to 1 (step 950). In this configuration, the pFETs 620*d-e* switch on and the pFETs 620*c,f-g* switch off. The nFET 625*c* turns on and generates a tail current for the current-mode pre-driver. Current is allowed to flow through the relatively bigger impedance resistors 630*a-b*. In this configuration the pre-driver 520 output signals in_n 580 and in_p 582 may have the configurable slowest slew rate, and the output driver 530 output signal tx_n 595 and tx_p 597 may have the configurable slowest rise/fall time. Input data may be received (at step 960), may be switched and/or driven at the slowest slew rate (step 970), and may be transmitted or driven as output (step 980). It is contemplated that the steps as shown in FIG. 9 are not limited to the order in which they are described above. In accordance with one or more embodiments, the steps shown in FIG. 9 may be performed sequentially, in parallel, or in alternate order(s) without departing from the spirit and scope of the embodiments presented herein.

Turning to FIG. 10, a flowchart depicting deactivation of the CML output driver 310 is shown, in accordance with one or more embodiments. For purposes of this description, it is assumed that a digital signal 0 equals 0V (i.e., GND 606) and a digital signal 1 equals VDD 605. At step 1010, the deactivation is selected. To disable/deactivate the bias and control 510, the bias_en 535 may be set to 0 (step 1020). To deactivate the output driver 530, the term_en_b may be set to 1 and the vbn_drv 575 may be set to 0 (step 1030). To deactivate the pre-driver 520, the vbn_predrv 570 may be set to 0 (step 1040). This configuration may result in the bias and control 510, the pre-driver 520 and the output driver 530 being disabled. It is contemplated that the steps as shown in FIG. 10 are not limited to the order in which they are described above. In accordance with one or more embodiments, the steps shown in FIG. 10 may be performed sequentially, in parallel, or in alternate order(s) without departing from the spirit and scope of the embodiments presented herein.

It is also contemplated that, in some embodiments, different kinds of hardware descriptive languages (HDL) may be used in the process of designing and manufacturing very large scale integration circuits (VLSI circuits) such as semiconductor products and devices and/or other types semiconductor devices. Some examples of HDL are VHDL and Verilog/Verilog-XL, but other HDL formats not listed may be used. In one embodiment, the HDL code (e.g., register transfer level (RTL) code/data) may be used to generate GDS data, GDSII data and the like. GDSII data, for example, is a descriptive file format and may be used in different embodiments to represent a three-dimensional model of a semiconductor product or device. Such models may be used by semiconductor manufacturing facilities to create semiconductor products and/or devices. The GDSII data may be stored as a database or other program storage structure. This data may also be stored on a computer readable storage device (e.g., data storage units 160, RAMs 155 (including embedded RAMs), compact discs, DVDs, solid state storage and/or the like). In one embodiment, the GDSII data (or other similar data) may be adapted to configure a manufacturing facility (e.g., through the use of mask works) to create devices capable of embodying various aspects of the instant invention. In other words, in various embodiments, this GDSII data (or other similar data) may be programmed into a computer 100, processor 125/140 or controller, which may then control, in whole or part, the operation of a semiconductor manufacturing facility (or fab) to create semiconductor products and devices. For example, in one embodiment, silicon wafers containing 10T bitcells 500, 10T bitcell arrays 420 and/or array banks 410 may be created using the GDSII data (or other similar data).

It should also be noted that while various embodiments may be described in terms of memory storage for graphics processing, it is contemplated that the embodiments described herein may have a wide range of applicability, not just for graphics processes, as would be apparent to one of skill in the art having the benefit of this disclosure.

The particular embodiments disclosed above are illustrative only, as the invention may be modified and practiced in different but equivalent manners apparent to those skilled in the art having the benefit of the teachings herein. Furthermore, no limitations are intended to the details of construction or design as shown herein, other than as described in the claims below. It is therefore evident that the particular embodiments disclosed above may be altered or modified and all such variations are considered within the scope and spirit of the claimed invention.

Accordingly, the protection sought herein is as set forth in the claims below.

What is claimed is:

1. A method comprising:
providing a data transmission device having a voltage-mode driver and a plurality of current-mode drivers coupled to an output driver;
selecting, at the data transmission device, at least one of a plurality of slew rate control settings based at least upon a speed of data transmission;
receiving input data at the data transmission device, wherein the input data is received at the data transmission speed;
switching the received input data in accordance with the selected at least one of a plurality of slew rate control settings using at least one of the voltage-mode driver or one of the plurality of current-mode drivers; and
sending output data from the data transmission device at the data transmission speed.

2. The method of claim 1, wherein switching the received input data further comprises driving the received input data to the output driver.

3. The method of claim 2, wherein sending output data comprises sending the output data from the output driver.

4. The method of claim 3, further comprising:
providing, at the data transmission device, at least one enable signal adapted to activate at least one of the voltage-mode driver, the one of the plurality of current-mode drivers, or the output driver.

5. The method of claim 1, wherein receiving input data and transmitting output data each comprise receiving and transmitting differential data signals respectively.

6. The method of claim 5, wherein the input data and the output data are of a serial advanced technology attachment (SATA) input/output format.

7. A method comprising:
selecting, at a data transmission device, a slew rate control setting of a plurality of slew rate control settings based on a speed of data transmission of an input data signal; and
selecting one of a voltage-mode driver portion or a current-mode driver portion of the data transmission device to switch the input data signal as an output data signal at the data transmission speed based on the selected slew rate control setting.

8. The method of claim 7, wherein selecting one of the voltage-mode driver portion or the current-mode driver portion to switch the input data signal as the output data signal comprises:
switching the input data signal as the output data signal using the voltage-mode driver portion responsive to the selected slew rate control setting comprising a first slew rate control setting of the plurality of slew rate control settings; and
switching the input data signal as the output data signal using the current-mode driver portion responsive to the selected slew rate control setting comprising a second slew rate control setting of the plurality of slew rate control settings.

9. The method of claim 8, wherein:
the first slew rate control setting represents a faster slew rate than the second slew rate control setting.

10. The method of claim 9, wherein:
the first slew rate control setting is selected for transmitting the output data signal in accordance with a serial advanced technology attachment (SATA) generation 2 input/output format; and
the second slew rate control setting is selected for transmitting the output data signal in accordance with a SATA generation 2 input/output format.

11. The method of claim 7, wherein the input data signal and the output data signal comprise differential signals.

12. The method of claim 11, wherein the input data signal and the output data signals are formatted in accordance with a serial advanced technology attachment (SATA) input/output format.

13. The method of claim 7, wherein switching the input data signal further comprises driving the input data signal to an output driver.

14. The method of claim 13, further comprising:
providing, at the data transmission device, at least one enable signal adapted to activate at least one of the voltage-mode driver portion, the current-mode driver portion, and the output driver.

* * * * *